United States Patent [19]
Tung

[11] Patent Number: 6,120,303
[45] Date of Patent: Sep. 19, 2000

[54] PICK-UP FOR CARD CONNECTOR

[75] Inventor: Shun-Chi Tung, Tu-Chen, Taiwan

[73] Assignee: Hon Hai Precision Ind. Co., Ltd., Taipei Hsien, Taiwan

[21] Appl. No.: 09/119,491

[22] Filed: Jul. 20, 1998

[30] Foreign Application Priority Data

Oct. 20, 1997 [TW] Taiwan ................................ 86217825

[51] Int. Cl.[7] .................................................. H01R 13/60
[52] U.S. Cl. ............................................ 439/41; 439/940
[58] Field of Search ............................... 439/41, 42, 940,
439/148, 149, 135, 64, 377, 701, 686, 689,
695; 29/832, 840, 876, 874, 879, 878, 739,
740, 837

[56] References Cited

U.S. PATENT DOCUMENTS

| | | | |
|---|---|---|---|
| 4,396,245 | 8/1983 | Lane | 439/148 |
| 5,499,162 | 3/1996 | Bartuska et al. | 361/737 |
| 5,507,657 | 4/1996 | Seto et al. | 439/135 |
| 5,681,174 | 10/1997 | Correll, Jr. et al. | 439/135 |
| 5,716,221 | 2/1998 | Kantner | 439/64 |

*Primary Examiner*—Paula Bradley
*Assistant Examiner*—Ross Gushi

[57] ABSTRACT

A rectangular pick-up is disclosed for use with an electrical card connector including a housing fixedly receiving a number of contacts each having a contact portion for engaging with an inserted card and a tail portion for being soldered to a PCB by SMT, and two guiding rails extending from lateral ends of the housing for guiding the card into/out of the connector. The pick-up is integrally formed by plastic injection molding with an upper wall, a lower wall, a front side, a rear side and two lateral arms each defining a lateral protrusion. A cavity is defined in the pick-up and is exposed to the rear side of the pick-up. When the pick-up is mounted to the connector, the rear side engages with the housing, the lateral arms are received in the guiding rails, the protrusions interferentially engage with the rails, and the cavity receives the contact portions of the contact therein. The upper wall defines a flat surface which can receive a vacuum force from a vacuum tool whereby the connector together with the pick-up can be moved to a predetermined position on the PCB.

5 Claims, 5 Drawing Sheets

PICK-UP FOR CARD CONNECTOR

BACKGROUND OF THE INVENTION

1. Field of the Invention

The present invention relates to a pick-up for an electrical connector, and particularly to a removable pick-up for an electrical card connector whereby the card connector can be moved to a predetermined position on a printed circuit board by a vacuum force.

2. The Prior Art

To automatically move an electrical connector to a predetermined position on a printed circuit board (PCB) by a vacuum suction whereby the connector can be soldered to the PCB by SMT (surface mounting technology), the connector needs to be attached with a pick-up having a flat surface for the vacuum suction to be applied thereon. Such a pick-up in accordance with a variety of connectors has many different designs. Taiwan Patent Application No. 83110056 and U.S. Pat. Nos. D371,541, 4,396,245, 5,026,295, 5,055,971, 5,147,209, 5,242,311 and 5,249,977 disclose suck pick-ups.

However, these pick-ups cannot be used with a card connector due to the unique configuration thereof.

For an electrical card connector 4 as shown in FIG. 4 which is a card bus connector, a housing 40 thereof which receives a number of contacts 41 does not have a sufficient flat area for a tool to apply a vacuum force thereto, thus the connector 4 must be manually positioned on a PCB. This not only lengthens the assembly time of the connector to the PCB, but also compromises the accuracy of positioning the connector on the PCB.

To solve this problem, FIG. 5 shows a card connector 5 having a pick-up 51 formed as a flat plate integrally formed on a housing (not shown) thereof between two guiding rails 50 in order to receive a vacuum suction applied by a tool. The provision of the pick-up 51 increases the overall height of the card connector 5, which is disadvantageous in view of the trend of computer technology which requires components to occupy as limited a space as possible.

Hence, a pick-up which can eliminate the above mentioned defects of current art is necessary.

SUMMARY OF THE INVENTION

Accordingly, an objective of the present invention is to provide a pick-up for a card connector whereby the connector can be moved to a predetermined position on a printed circuit board by a vacuum force.

Another objective of the present invention is to provide a pick-up for a card connector which can be removed from the connector after the connector is soldered to a printed circuit board so that the pick-up can be used again.

A further objective of the present invention is to provide a pick-up for a card connector which will not increase the overall height of the connector.

To fulfill the above mentioned objective, according to one embodiment of the present invention, a pick-up for a card bus connector is disclosed. The card bus connector includes an elongate housing fixedly receiving a number of contacts each having a contact portion for electrically engaging with an electronic card inserted into the connector and a tail portion for being soldered to a printed circuit board (PCB) by SMT, and two guiding rails integrally extending from lateral ends of the housing for guiding the card into/out of the connector. The pick-up is formed by plastic injection molding to have a substantially flat rectangular configuration with an upper wall, a lower wall, a rear side, a front side and two lateral arms. A cavity is defined in the pick-up and is exposed to the rear side. Each lateral arm forms a side protrusion. The upper wall defines a flat surface for receiving a vacuum force from a vacuum tool. A reinforcing rib is formed between the upper and lower walls near the front side. To mount the pick-up to the card bus connector, the side arms are moved along the rails to reach a position where the rear side of the pick-up engages with the housing, the cavity receives the contact portions of the contacts therein, and the side protrusions interferentially engage with the rails whereby when the pick-up is moved by the tool applying the vacuum force to the upper wall, the connector is moved accordingly. After soldering the connector to the PCB by SMT, an assembler can easily disengage the pick-up from the connector by gripping a depression in the upper wall of the pick-up whereby the pick-up can be used again with another card connector.

DETAILED DESCRIPTION OF THE PREFERRED EMBODIMENT

Reference will now be made in detail to the preferred embodiment of the present invention.

Figure 1:
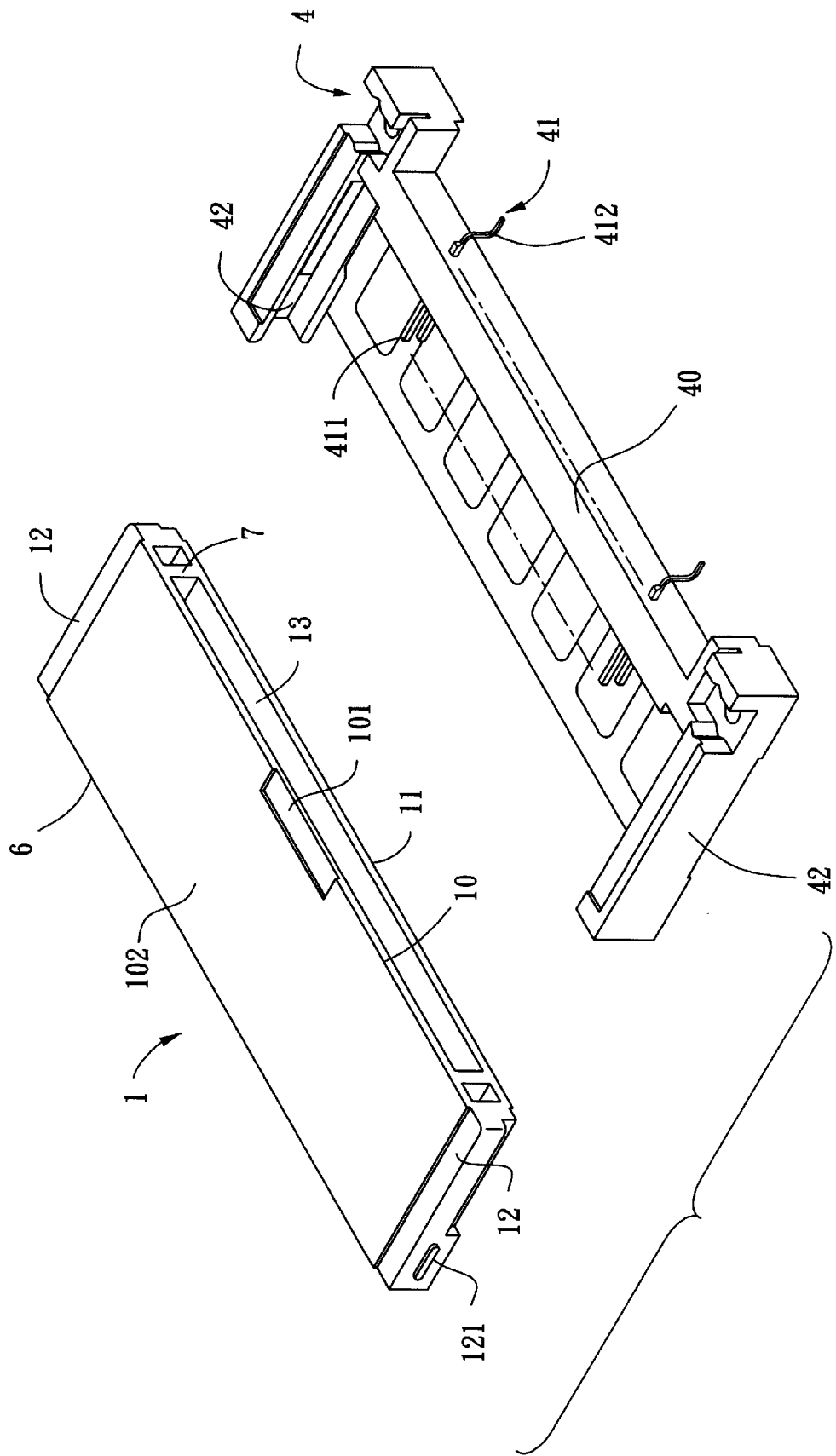
FIG. 1 is a perspective, exploded view of a pick-up in accordance with the present invention and a card bus connector.
Figure 2:
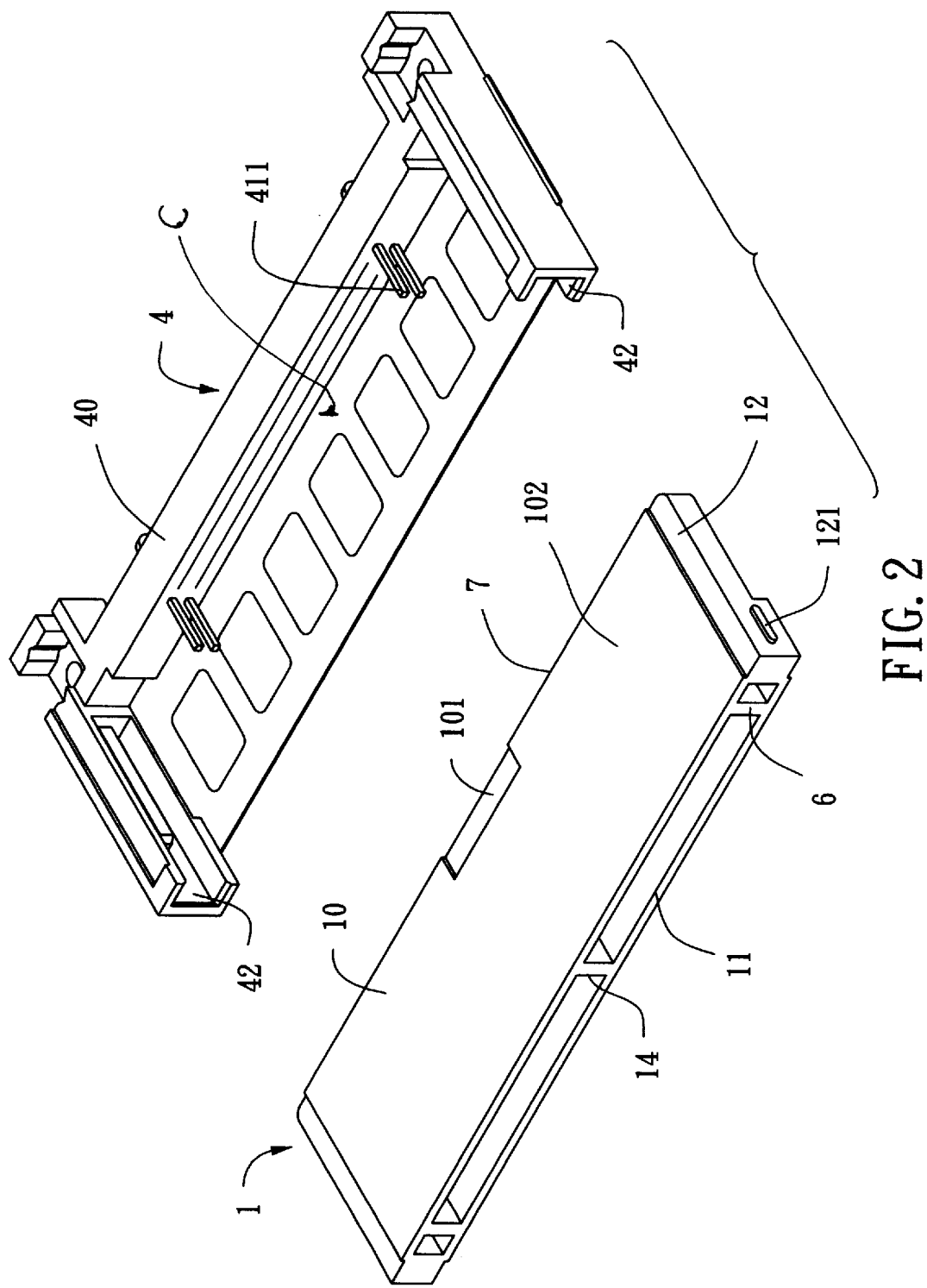
FIG. 2 is similar to FIG. 1 as viewed from a different direction.
Figure 4:
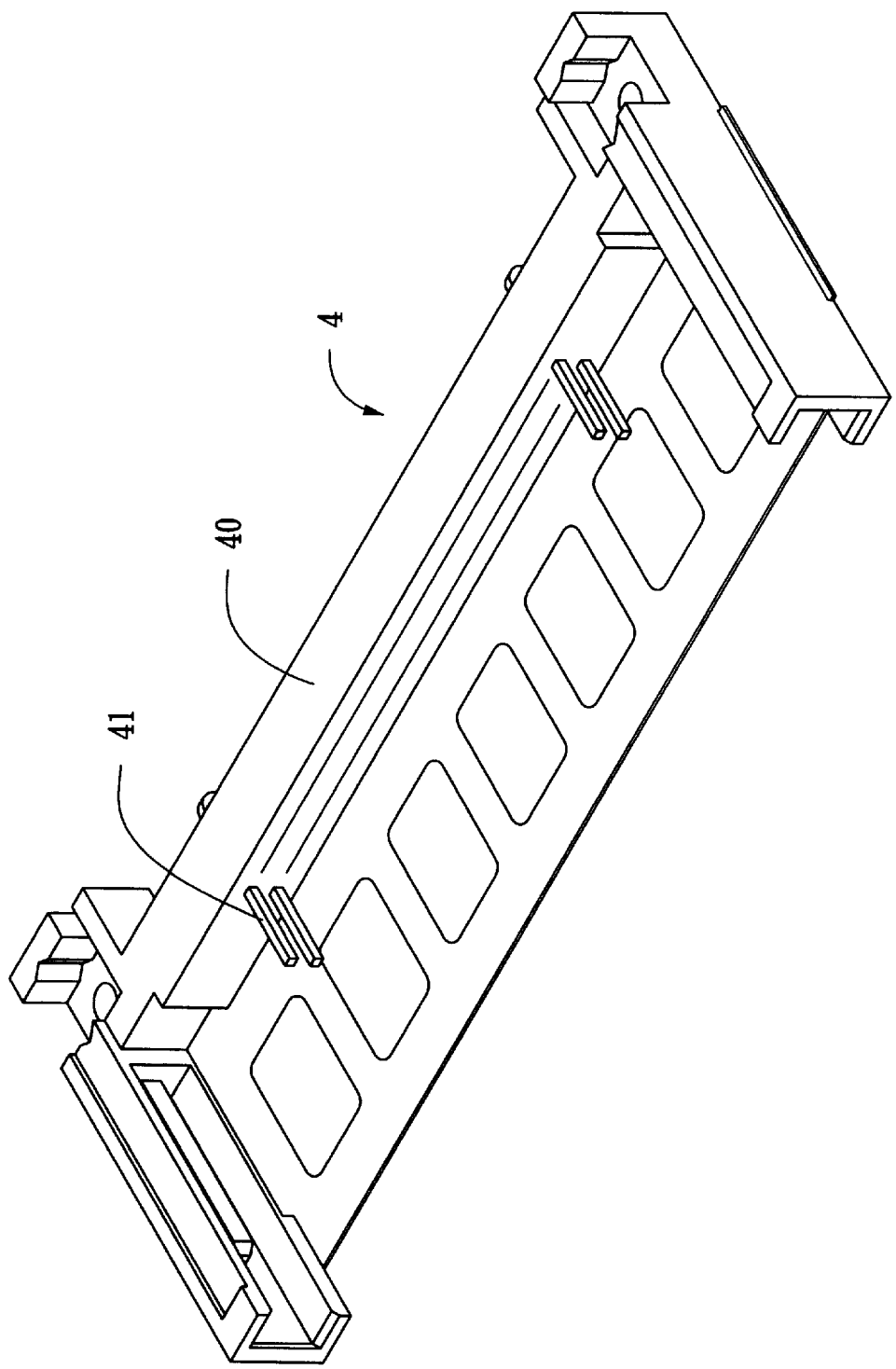
FIG. 4 shows a card bus connector.
Figure 5:
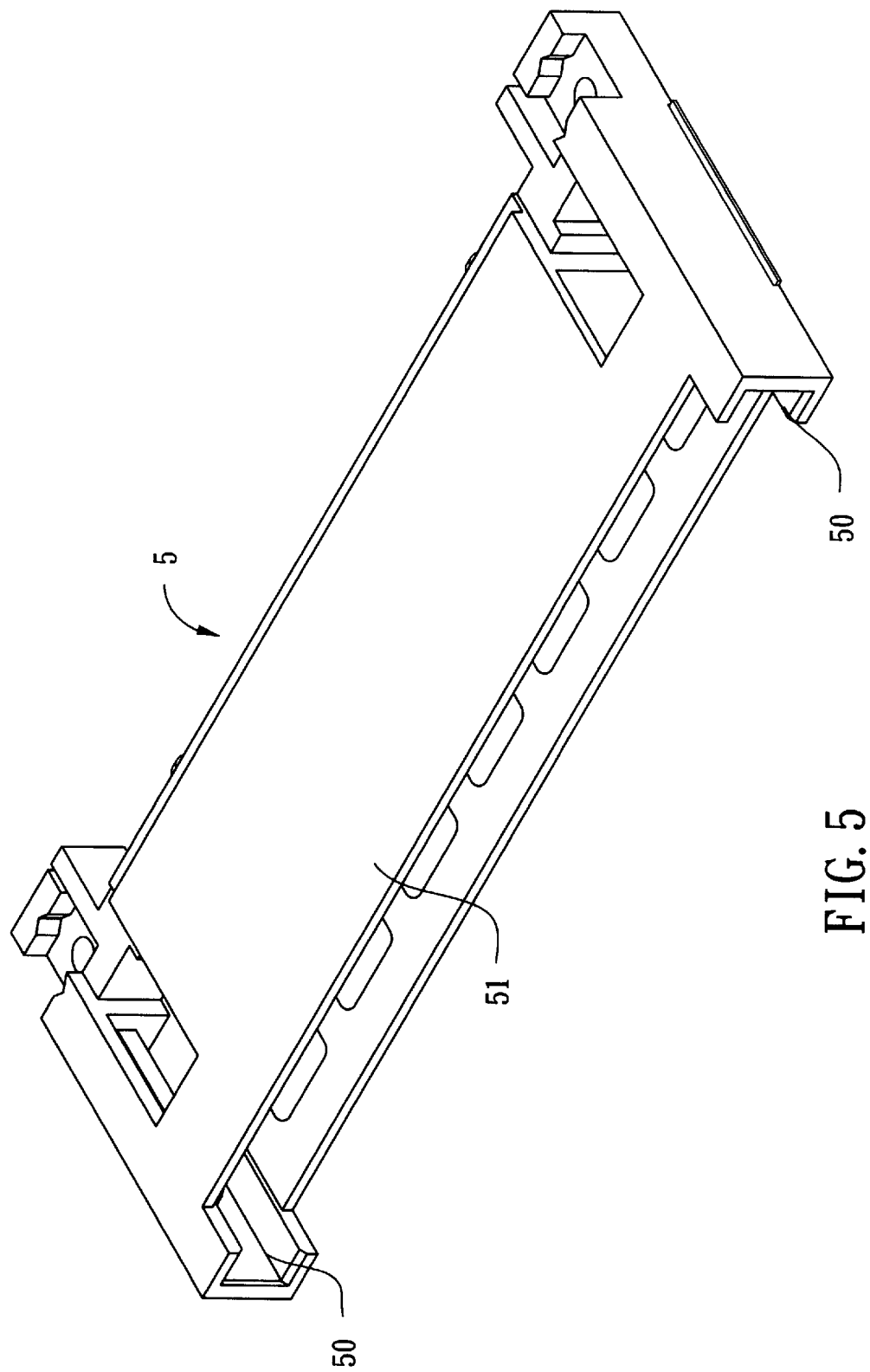
FIG. 5 shows a card bus connector with a conventional pick-up integrally formed thereon.

FIGS. 1 and 2 show a card bus connector 4 having the same configuration as that shown in FIG. 4. The connector 4 has a housing 40 fixedly receiving a number of contacts 41 having contact portions 411 for engaging with an electronic card (not shown) inserted into the space C of the connector 4 and tail portions 412 for being soldered to a printed circuit board (not shown) by SMT. Two guiding rails 42 integrally extend from lateral ends of the housing 40 for guiding the card into/out of the connector 4.

A pick-up 1 in accordance with the present invention is formed by plastic injection molding to have a flat, rectangular configuration with a front side 6, a rear side 7, an upper wall 10, a lower wall 11 and two lateral arms 12. Each arm 12 forms a protrusion 121 laterally projecting therefrom near the front side 6. A cavity 13 is defined in the pick-up 1 and is exposed to the rear side 7. The upper wall 10 defines an upper flat face 102 for receiving a vacuum force applied by a tool (not shown) and a depression 101 adjacent to the rear side 7. The depression 101 enables an assembler to conveniently grip the pick-up 1 and disengage it from the connector 4. To enhance the rigidity of the pick-up 1, a rib 14 is formed between the upper and lower walls 10, 11 and extends to the front side 6.

Figure 3:
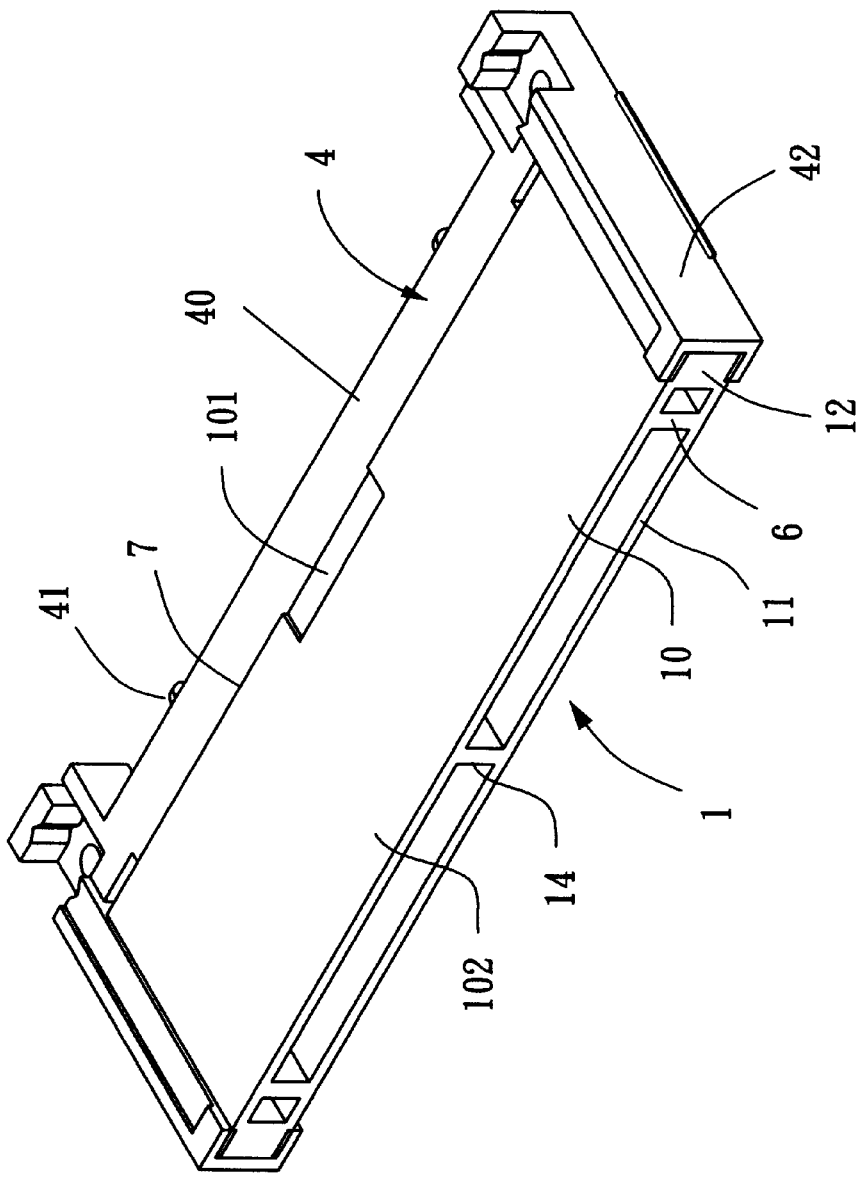
FIG. 3 is a perspective view of the pick-up assembled with the card bus connector.

To mount the pick-up 1 to the connector 4, the lateral arms 12 are moved along the rails 42 to reach a position as shown in FIG. 3, in which the arms 12 are received in the rails 42, the rear side 7 engages with the housing 40, the contact portions 411 of the contacts 41 are received in the cavity 13, and the side protrusions 121 interferentially engage with the rails 42 (although not shown in FIG. 3, this can be easily understood by those skilled in the art), whereby the pick-up 1 is fixedly received with the space C of the connector 4.

To position the connector 4 to the PCB, the vacuum tool applies a vacuum force to the flat face 102 to place the pick up 1 together with the connector 4 at a predetermined position on the PCB. The tail portions 412 of the contacts 41 of the connector 4 are then soldered to the PCB by SMT. Thereafter, the vacuum tool is removed from the pick-up 1 and the pick-up 1 is then disengaged from the connector 4 to be used again. Finally, a guiding frame, an ejector mechanism and a shielding (all not shown) are mounted to the connector 4 to complete the assembly thereof.

It can be noted that one feature of the invention is that different from most prior arts in which the pick-up is assembled to the connector in the same direction with the normal line of the suction flat face, i.e., both of them being vertical, the pick-up 1 of the invention is assembled to connector 4 in horizontal direction (i.e., the assembling/disassembling direction) which is orthogonal, to the normal line of the flat face 102 (i.e., the suction/motion direction). Moreover, because horizontal installation of the pick-up with regard to the connector allows interlocking structures arranged on both connector and pick-up, i.e., the vertical restriction relation between the rails 42 of the connector 4 and the arms 12 of the pick-up 1, it assures no disengagement between the connector 4 and the pick-up occurs during the vertical pick-and-place soldering suction/motion procedure due to some combined factors, such as improper/insufficient grasping retention of the pick-up with regard to the connector, the vibration during moving, or the gravity effect of the assembled connector/pick-up, etc.. The traditional arrangement along the same direction of assembling/suction requires relatively larger interference forces between the pick-up and the connector for avoiding unexpected withdrawal of the pick-up from the connector during suction, thus resulting in some inconveniences or even damages to both parts which may jeopardize the pick-and-place process. In contrast, the horizontal assembling and the corresponding vertical restriction structure arrangement for assuring securement between the pick-up and the connector of the invention provides a dedicate way to perform a better reliable pick-and-place effect.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A combination of a card connector and a pick-up, comprising:

a card connector having an elongate housing fixedly receiving a number of contacts each having a contact portion for engaging with a card inserted into the connector, and a tail portion for being soldered to a printed circuit board by SMT, and guiding rails extending from lateral ends of the housing for guiding the card into and out of the connector; and a pick-up having a substantially rectangular configuration with a rear side engaging with the housing, a front side opposite the rear side, an upper wall, a lower wall, two lateral arms received in the rails, and a cavity exposed to the rear side and receiving the contact portions of the contacts therein while said pick-up being not mechanically engaged with the contact portions of the contacts, the upper wall defining a flat face for receiving a vacuum force applied by a vacuum tool whereby the combination can be moved by the tool to a predetermined position on the printed circuit board.

2. The combination in accordance with claim 1, wherein the upper wall of the pick-up defines a depression whereby an assembler can conveniently grip the pick-up and disengage it from the connector.

3. The combination in accordance with claim 1, wherein the pick-up includes a rib formed between the upper and lower walls near the front side thereof.

4. The combination in accordance with claim 1, wherein each lateral arm of the pick-up forms a protrusion engaging with the corresponding rail.

5. The combination in accordance with claim 4, wherein the protrusions are located near the front side of the pick-up.

* * * * *